(12) United States Patent
Huang et al.

(10) Patent No.: US 11,841,742 B2
(45) Date of Patent: Dec. 12, 2023

(54) ELECTRONIC DEVICE, EXTERNAL MODULE THEREOF, MANUFACTURING METHOD OF EXTERNAL MODULE THEREOF AND ASSEMBLY METHOD FOR CONFIGURING EXTERNAL MODULE THEREOF

(71) Applicant: GETAC TECHNOLOGY CORPORATION, New Taipei (TW)

(72) Inventors: Tzu-Chiu Huang, Taipei (TW); Juei-Chi Chang, Taipei (TW); Jui-Lin Yang, Taipei (TW)

(73) Assignee: GETAC TECHNOLOGY CORPORATION, New Taipel (TW)

(*) Notice: Subject to any disclaimer, the term of this patent is extended or adjusted under 35 U.S.C. 154(b) by 0 days.

(21) Appl. No.: 17/588,167

(22) Filed: Jan. 28, 2022

(65) Prior Publication Data
US 2022/0300037 A1  Sep. 22, 2022

Related U.S. Application Data

(60) Provisional application No. 63/163,597, filed on Mar. 19, 2021.

(51) Int. Cl.
| | |
|---|---|
| G06F 1/16 | (2006.01) |
| H01R 33/965 | (2006.01) |
| H01R 43/00 | (2006.01) |
| H05K 5/00 | (2006.01) |
| H01R 13/52 | (2006.01) |

(52) U.S. Cl.
CPC .......... *G06F 1/1632* (2013.01); *G06F 1/1624* (2013.01); *H01R 33/965* (2013.01); *H01R 43/005* (2013.01); *H05K 5/0069* (2013.01); *H01R 13/5219* (2013.01); *H05K 5/0052* (2013.01)

(58) Field of Classification Search
CPC ...... G06F 1/1658; G06F 1/187; G06F 1/1632; G06F 1/1656; G06F 1/1615; G06F 1/1624; G11B 33/122; H01R 33/965; H01R 43/005; H05K 5/0069; H05K 5/0052
See application file for complete search history.

(56) References Cited

U.S. PATENT DOCUMENTS

| | | | | |
|---|---|---|---|---|
| 7,491,070 | B2* | 2/2009 | Chen .................. | H01R 12/7047 439/95 |
| 8,550,831 | B2* | 10/2013 | Nishijima ............ | H01R 13/518 439/248 |
| 2022/0083105 | A1* | 3/2022 | Furujiku ................ | G11B 25/04 |

* cited by examiner

*Primary Examiner* — James Wu
(74) *Attorney, Agent, or Firm* — Cooper Legal Group, LLC

(57) ABSTRACT

The present invention provides an external module including a housing and an electronic component. One surface of the housing is provided with a through hole. The electronic component is disposed in the housing and includes a first connector, wherein the first connector is floatingly arranged in the housing and is exposed in the through hole.

15 Claims, 8 Drawing Sheets

ELECTRONIC DEVICE, EXTERNAL MODULE THEREOF, MANUFACTURING METHOD OF EXTERNAL MODULE THEREOF AND ASSEMBLY METHOD FOR CONFIGURING EXTERNAL MODULE THEREOF

The application claims priority to U.S. Provisional Application No. 63/163,597, filed on Mar. 19, 2021, the disclosure of which is hereby incorporated by reference herein in its entirety.

BACKGROUND OF THE INVENTION

Field of the Invention

The present invention relates a rugged computer and, more particularly, to an electronic device having a quick detachable external module.

Description of the Prior Art

A rugged computer is often applied in a military or harsh operation environment, and provides better dust protection, waterproof level and impact resistance compared to common laptop computers. To prevent data leakage, the hard drive of a military rugged computer is designed as a quick detachable external module that is then assembled to a host. To achieve the purpose of being fast detachable for a current military rugged computer, the external module can only be fittingly assembled but not locked to a host. When the rugged computer receives impact in a specific direction, although the external module may not become disengaged, any slight shift of the external module is nonetheless sufficient to cause poor contact of a connector connecting the external module to the host, resulting in instantaneous signal interruption and hence an operating system failure.

SUMMARY OF THE INVENTION

The present invention provides an electronic device, a fast detachable external module thereof, a manufacturing method for an external module thereof, and an assembly method for configuring an external module thereof.

An external module provided by the present invention includes a housing and an electronic component. One surface of the housing is provided with a through hole. The electronic component is disposed in the housing and includes a first connector, wherein the first connector is floatingly arranged in the housing and is exposed in the through hole.

In the external module of the present invention, a part of the electronic component thereof is fixedly connected to the housing. The electronic component is shaped as a long plate and is perpendicular to an opening direction of the through hole, and an insertion direction of the first connector is perpendicular to the electronic component. The electronic component is shaped as a long plate, one end of the electronic component is fixedly connected to the housing, and the first connector is located on the other end of the electronic component. An elastic element is sandwiched between the electronic component and the housing, and the elastic element and the first connector are respectively disposed on two opposite surfaces of the electronic component.

In the external module of the present invention, the electronic component includes a solid state drive and an adaptor board connected to the solid state drive. The first connector is disposed at the adaptor board and is electrically connected to the solid state drive. At least a part of the solid state drive is fixedly connected to the housing, and the adaptor board is floatingly arranged in the housing. The electronic component is shaped as a long plate, one end of the electronic component is fixedly connected to the housing, and the adaptor board is located on the other end of the electronic component.

A manufacturing method for an external module further provided by the present invention includes the steps of: providing a housing and an electronic component, wherein one surface of the housing is provided with a through hole and the electronic component includes a first connector; disposing the electronic component in the housing, and floatingly arranging the first connector in the housing and exposing the first connector in the through hole.

In the manufacturing method for an external module of the present invention, the electronic component thereof is shaped as a long plate and an insertion direction of the first connector is perpendicular to the electronic component, and the electronic component is arranged to be perpendicular to an opening direction of the through hole in one step. The electronic component is shaped as a long plate, the first connector is located on one end of the electronic component, and the other end of the electronic component is fixedly connected to the housing in one step.

The manufacturing method for an external module of the present invention further includes the step of: disposing an elastic element on a side of the electronic component opposite to the first connector such that the elastic element is sandwiched between the electronic component and the housing.

In the manufacturing method for an external module of the present invention, a part of the electronic component is fixedly connected to the housing in one step. The electronic component includes a solid state drive and an adaptor board connected to the solid state drive, at least a part of the solid state drive is fixedly connected to the housing and the adaptor board is floatingly arranged in the housing in one step. The electronic component is shaped as a long plate, the adaptor board is located on one end of the electronic component, and the other end of the electronic component is fixedly connected to the housing in one step.

An electronic device further provided by the present invention includes an external module and a host casing. The external module includes a housing and an electronic component. The electronic component is disposed in the housing and includes a first connector, the housing is provided with a through hole corresponding to the first connector, and the first connector is floatingly arranged in the through hole. An outer surface of the host casing is provided with an accommodating chamber, the external module is embedded in the accommodating chamber, and a second connector is provided in the accommodating chamber. When one end of the external module away from the first connector is fitted on one side of the accommodating chamber and the first connector is docked with the second connector, the housing is floatingly shiftable from the first connector.

In the electronic device of the present invention, an elastic element is sandwiched between the electronic component and the housing, and the elastic element and the first connector are respectively disposed on two opposite surfaces of the electronic component. When the housing is shifted from the first connector, the amount of compression received by the elastic element is reduced.

An assembly method for configuring an external module to an electronic device further provided by the present invention includes the steps of: providing an electronic device, an electronic component and a housing, wherein a host casing of the electronic device is provided with an accommodating chamber, an insertion hole is provided in the accommodating chamber, a second connector is provided in the insertion hole, the electronic component is provided with a first connector, and the housing is provided with a through hole corresponding to the first connector; placing the electronic component into the housing to form an external module, and disposing the first connector at the through hole; and fitting one end of the external module away from the first connector to one side of the accommodating chamber first, and then docking the first connector with the second connector, such that the housing is floatingly shiftable from the first connector at this point in time.

The electronic component of the external module of the electronic device according to the present invention can be installed in the accommodating chamber at the bottom of the electronic device by a blind inverted fastening means, and can similarly be removed from the accommodating chamber at the bottom of the electronic device. The first connector of the external module is floatingly arranged in the housing and is allowed to be shiftable. Therefore, even if when the external module is not fixedly fastened at the host casing, the first connector and the second connector docked with each other are insusceptible to instantaneous signal interruption when strong impact is received.

DETAILED DESCRIPTION OF THE EMBODIMENTS

Figure 1:
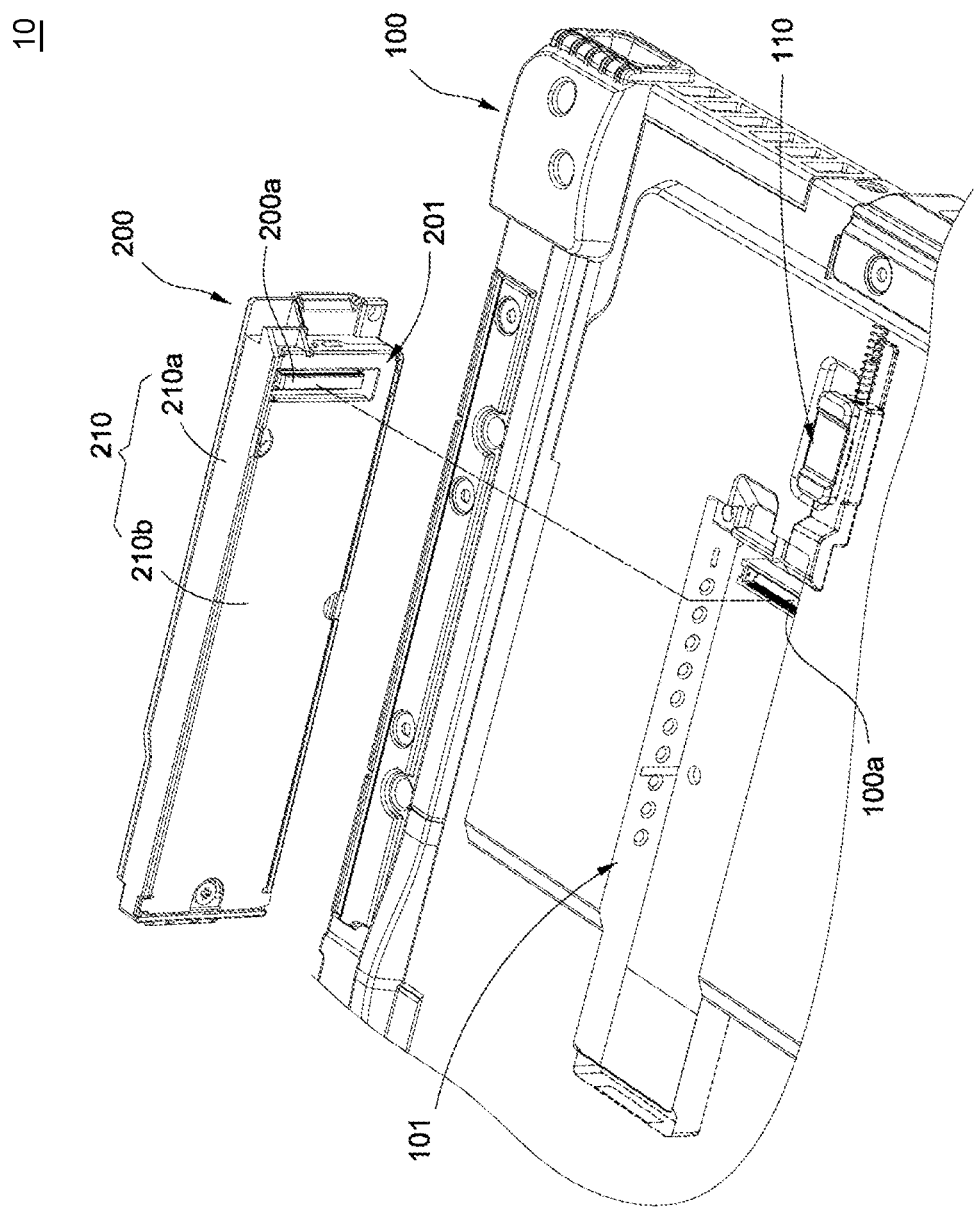
FIG. 1 is a three-dimensional exploded schematic diagram of an external module configured to an electronic device according to the present invention.
Figure 2:
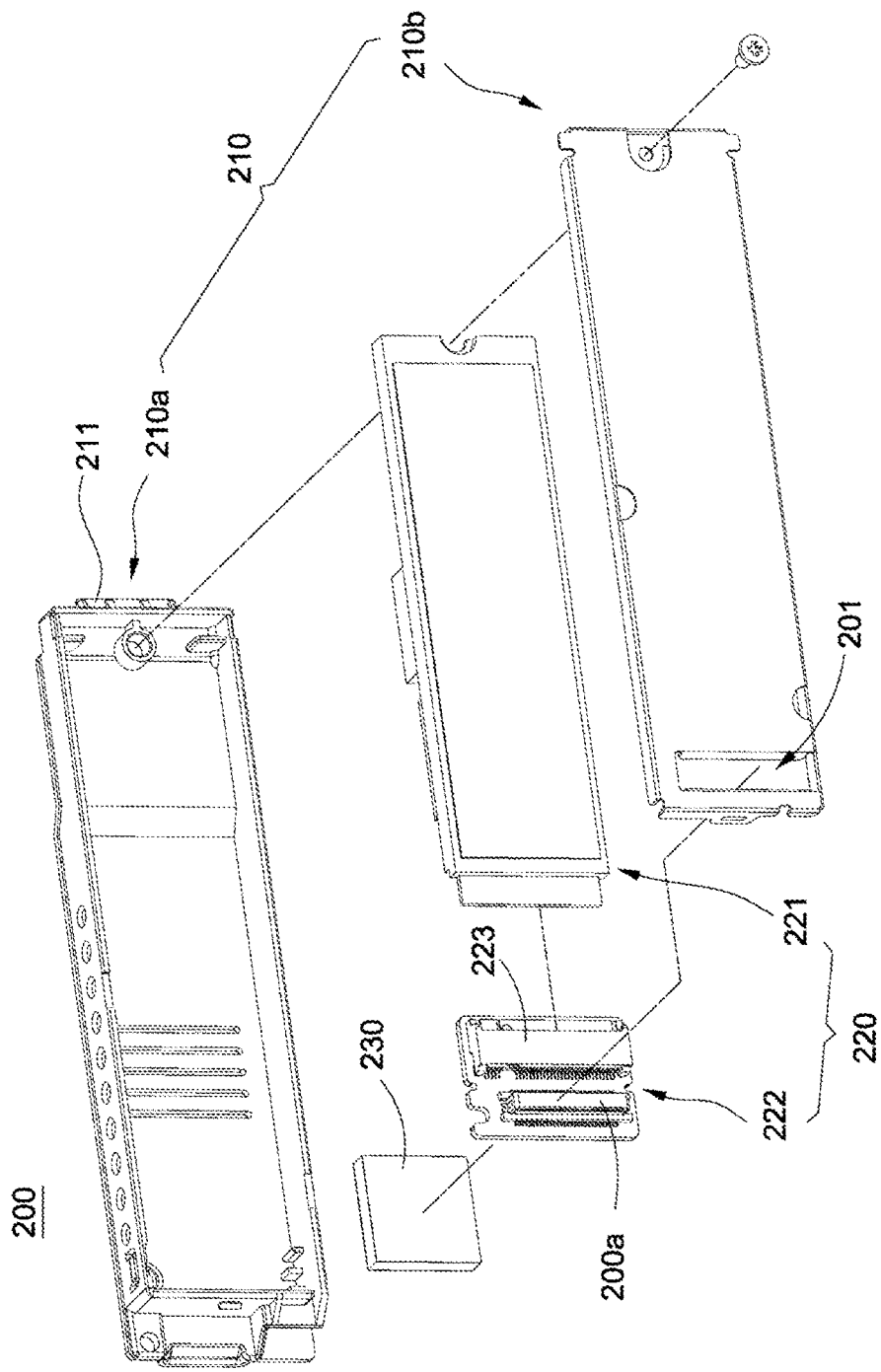
FIG. 2 is a three-dimensional exploded schematic diagram of an external module according to the present invention.
Figure 3:
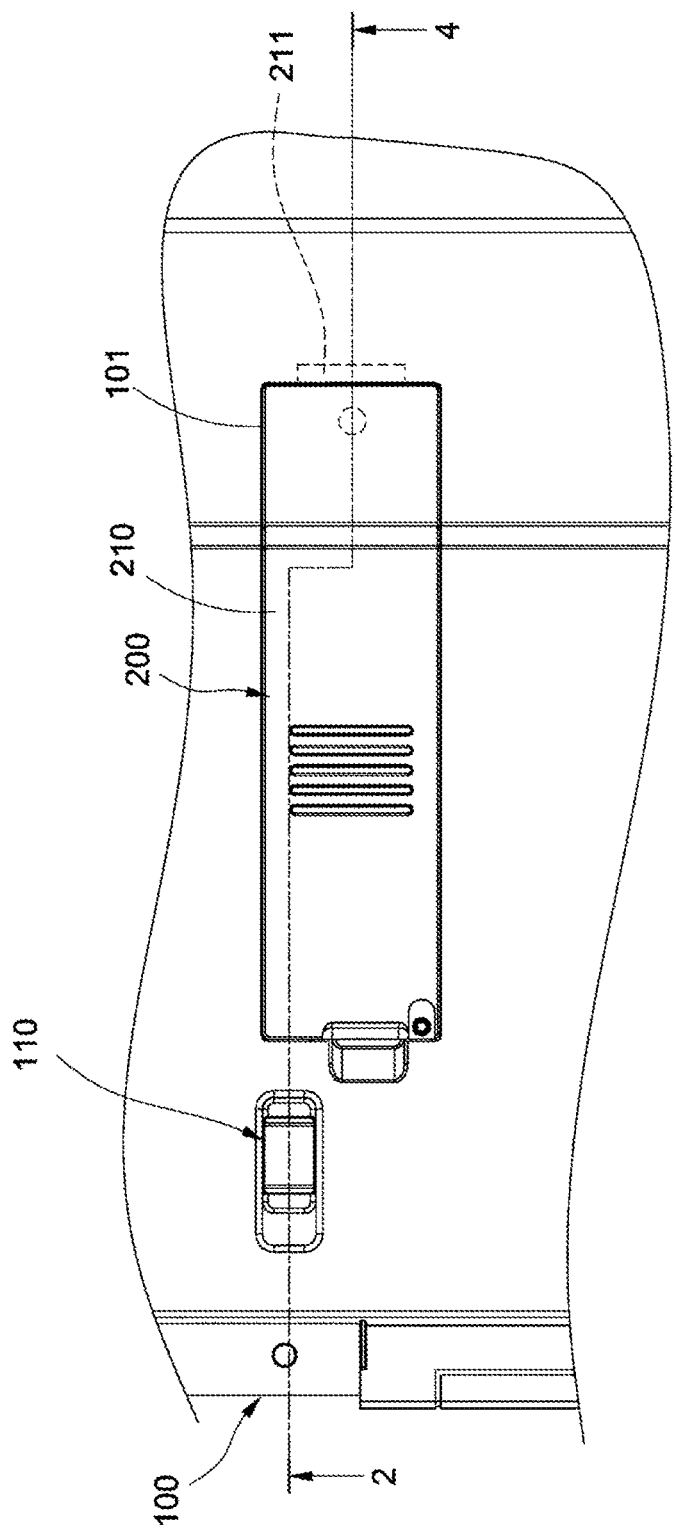
FIG. 3 is a schematic diagram of an external module of the present invention configured to an electronic device.

Referring to FIG. 1 to FIG. 3, the present invention provides an electronic device 10 which includes at least one host casing 100 and an external module 200.

In this embodiment, the host casing 100 is preferably a bottom portion or a back surface of the electronic device 10, or a part of the host casing 100 is a bottom portion of the electronic device 10. An outer surface of the host casing 100 is provided with an accommodating chamber 101, and the external module 200 is embedded in the accommodating chamber 101 so as to be assembled to the electronic device 10. The external module 200 includes a first connector 200a, and a second connector 100a for docking with the first connector 200a is disposed in the accommodating chamber 101 of the host casing 100. In this embodiment, a circuit board 120 is provided in the host casing 100, and the second connector 100a is provided on the circuit board 120. The bottom portion of the accommodating chamber 101 is provided with a through hole or is in an open form, and the second connector 100a is exposed through the bottom portion of the accommodating chamber 101 and is exposed in the accommodating chamber 101. A locking latch 110 is slidably provided on the host casing 100. The locking latch 110 is arranged on one side of the accommodating chamber 101, and at least a part of the locking latch 110 is exposed from the outer surface of the host casing 100 and can be pushed to latch the external module 200.

Referring to FIG. 2, the external module 200 includes a housing 210 and an electronic component 220 disposed in the housing 210. The housing 210 is flat in shape, and one surface of the housing 210 is provided with a through hole 201 corresponding to the first connector 200a. More specifically, the housing 210 includes a box 210a and a cover plate 210b. One end of the box 210a is provided with a tenon 211, the through hole 201 is provided at the cover plate 210b, the cover plate 210b closes the box 210a, and the tenon 211 and the through hole 201 are respectively on two ends of the housing 210. The first connector 200a is disposed in the electronic component 220, the electronic component 220 is disposed in the housing 210, and the first connector 200a is floatingly arranged in the housing 210 and is exposed in the through hole 201.

In this embodiment, the electronic component 220 is shaped as a long plate, a part of the electronic component 220 is fixedly connected to the housing 210 and is perpendicular to an opening direction of the through hole 201, and an insertion direction of the first connector 200a is perpendicular to the electronic component 220. More specifically, one end of the electronic component 220 is locked at the housing 210 by a screw, and the first connector 200a is located on the other end of the electronic component 220. An elastic element 230 may be selectively sandwiched between the electronic component 220 and the housing 210, and the elastic element 230 and the first connector 200a are respectively disposed on two opposite surfaces of the electronic component 220. In this embodiment, the elastic element 230 is preferably elastic foam; however, the present invention is not limited to the example above. For example, the elastic element 230 may also be a spring. When the housing 210 is shifted from the first connector 200a, the amount of compression received by the elastic element 230 is reduced.

Figure 4:
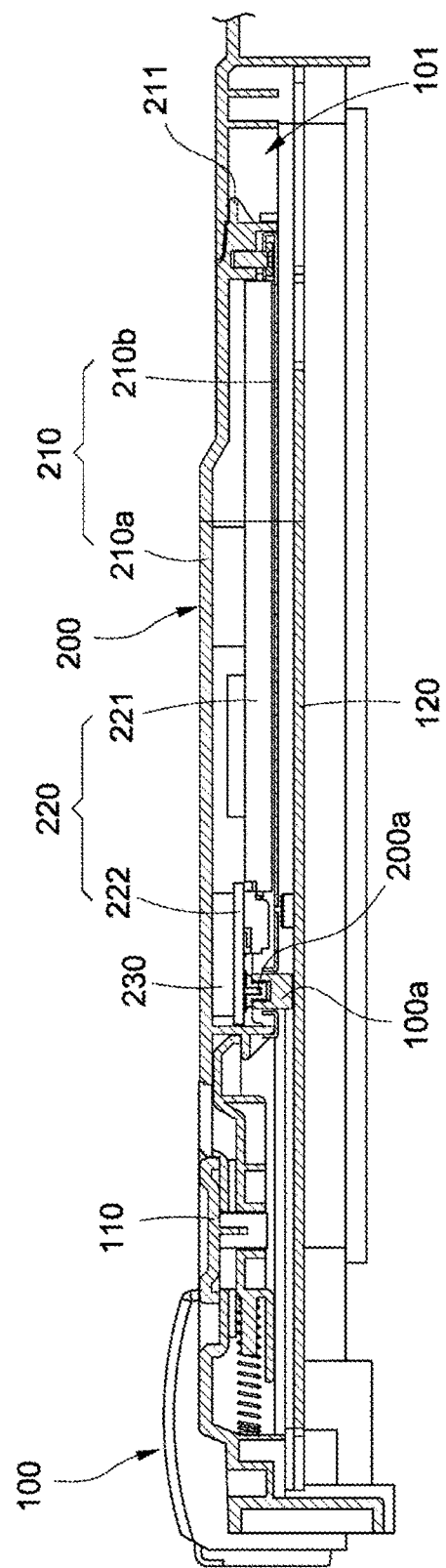
FIG. 4 is a cross-sectional diagram taken along section line 2-4 in FIG. 3.
Figure 5:
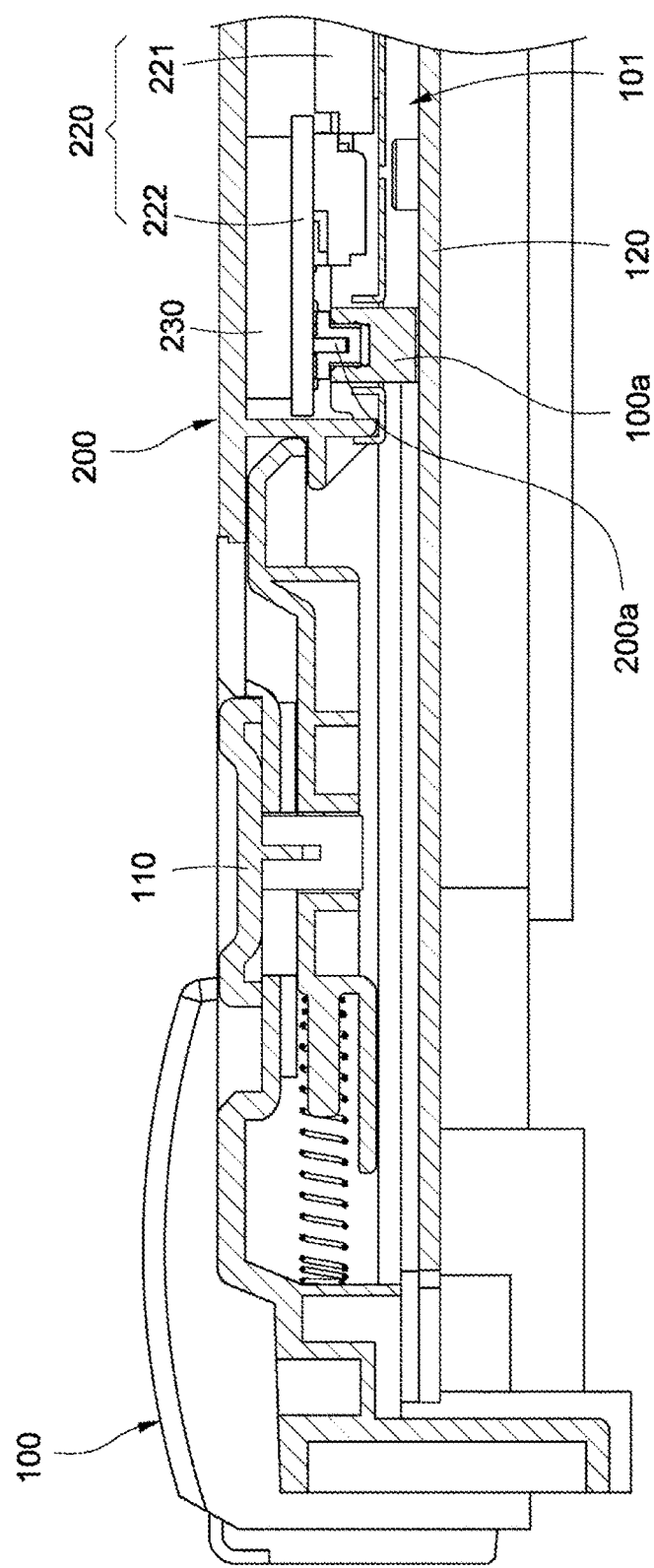
FIG. 5 and FIG. 6 are partial enlarged diagrams of FIG. 4.
Figure 6:
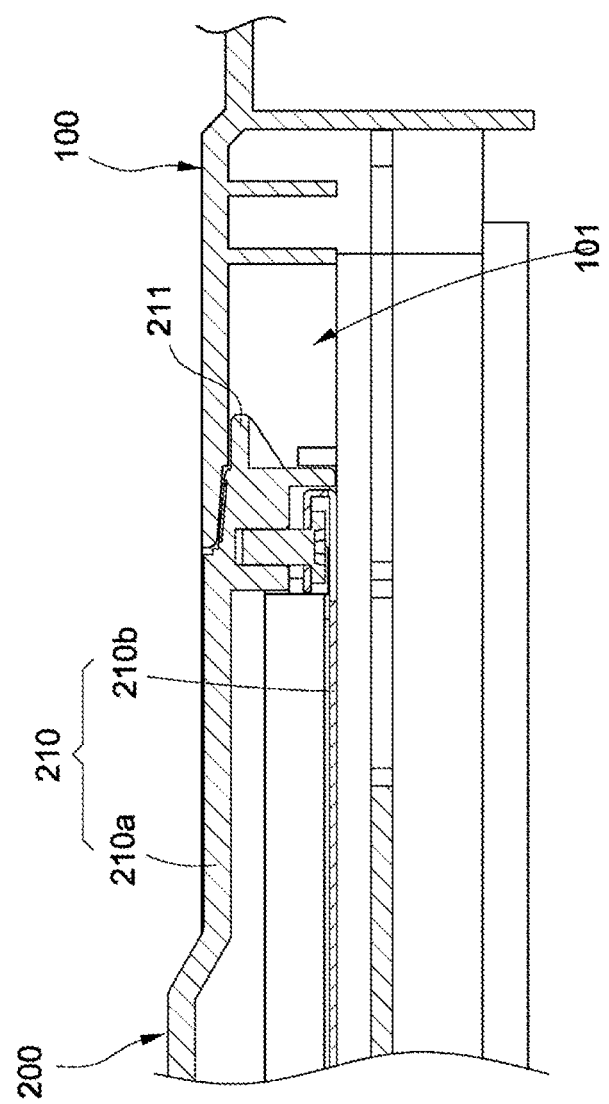

Referring to FIG. 3 to FIG. 5, during the process that a user holding the housing 210 plugs the first connector 200a with the second connector 100a, the elastic element 230 can overcome the counterforce caused by the second connector 100a, so as to reduce the amount of shift of the first connector 200a relative to the housing 210 and facilitate docking.

Referring to FIG. 2, and FIG. 4 to FIG. 6, in this embodiment, the electronic component 220 includes a solid state drive 221 and an adaptor board 222 connected to the solid state drive 221. As previously described, one end of the electronic component 220 is fixedly connected to the housing 210, the adaptor board 222 is located on the other end of the electronic component 220, and the first connector 200a is disposed at the adaptor board 222. The solid state drive 221 is shaped as a long plate, and at least a part of the solid state drive 221 is fixedly connected to the housing 210. In this embodiment, one end of the solid state drive 221 is locked at the housing 210 by the screw above, and the other end of the solid state drive 221 is inserted at the adaptor board 222 and is accordingly electrically connected to the first connector 200a. The adaptor board 222 is not fixedly connected to the housing 210, and is floatingly arranged in the housing 210. An adaptor 223 is preferably disposed at an edge of the adaptor board 222 for docking with the solid state drive 221, and the adaptor 223 is inserted in a direction perpendicular to the first connector 200a.

In the present invention, the external module 200 is in a fast detachable design, and thus the housing 210 of the external module 200 is not locked at the host casing 100. When the external module 200 is assembled in the accommodating chamber 101, one end of the external module 200 away from the first connector 200a is fitted by the tenon 211 on one side of the accommodating chamber 101, the first connector 200a is docked with the second connector 100a, and one end of the external module 200 on which the first connector 200a is disposed is locked by latching of the locking latch 110. Preferably, the locking latch 110 may be kept at a position that latches the external module 200 by a spring provided at the host casing 100. A part of the locking latch 110 is protrudingly exposed in the accommodating chamber 101, the locking latch 110 can be simultaneously withdrawn from the accommodating chamber 101 during the process of placing the external module 200 into the accommodating chamber 101, and the locking latch 110 is restored to latch the external module 200 once the external module 200 is completely placed in the accommodating chamber 101.

When the electronic device 10 receives impact, the housing 210 of the external module 200 not fixed to the host casing 100 may be slightly shifted from the host casing 100. Since the first connector 200a is floatingly arranged in the housing 210, the housing 210 is allowed to be floatingly shifted from the first connector 200a, thereby preventing instantaneous signal interruption of the first connector 200a from the second connector 100a due to the linkage.

Figure 7:
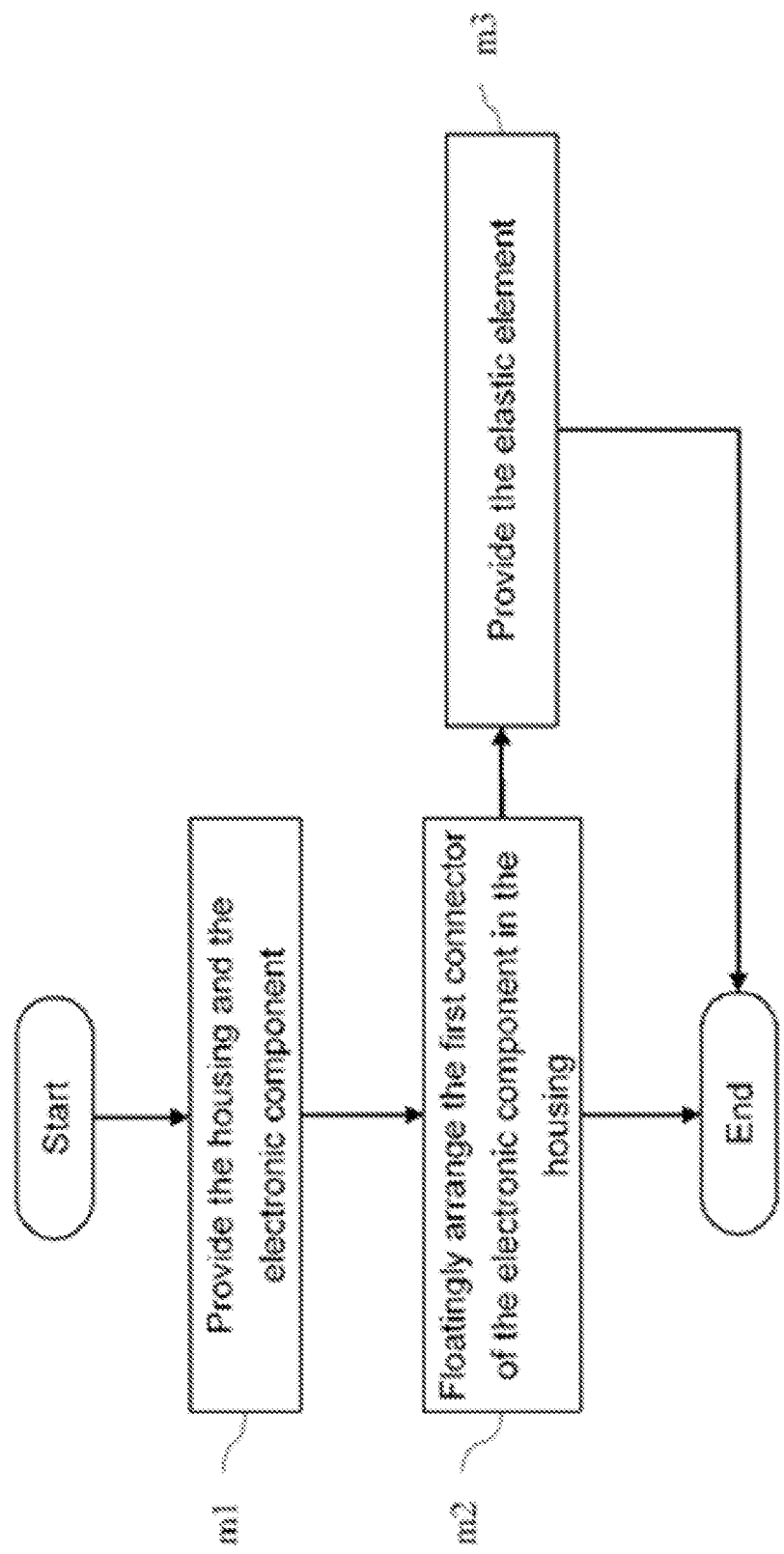
FIG. 7 is a flowchart of steps of a manufacturing method for an external module of the present invention.

Referring to FIG. 2 and FIG. 7, a manufacturing method for the external module 200 above is provided according to a second embodiment of the present invention. The manufacturing method includes the following steps.

First of all, in step m1, the housing 210 and the electronic component 220 are provided, wherein one surface of the housing 210 is provided with the through hole 201, and the electronic component 220 includes the first connector 200a. The electronic component 220 is shaped as a long plate. Specifically, the electronic component 220 includes the solid state drive 221 and the adaptor board 222 connected to the solid state drive 221. The adaptor board 222 is located on one end of the electronic component 220, the first connector 200a is disposed at the adaptor board 222, and the insertion direction of the first connector 200a is perpendicular to the electronic component 220.

In step m2 following step m1, the electronic component 220 is disposed in the housing 210, the electronic component 220 is configured to be perpendicular to the opening direction of the through hole 201, and the other end of the electronic component 220 is fixedly connected to the housing 210. Specifically, at least a part of the solid state drive 221 is fixedly connected to the housing 210. Moreover, the first connector 200a is floatingly arranged in the housing 210 and is exposed in the through hole 201. Specifically, the adaptor board 222 is floatingly arranged in the housing 210.

The manufacturing method for the external module 200 of the present invention may include step m3 following step m2. In step m3, an elastic element 230 is disposed on a side of the electronic component 220 opposite to the first connector 200a, such that the elastic element 230 is sandwiched between the electronic component 220 and the housing 210 so as to floatingly position the first connector 200a.

Figure 8:
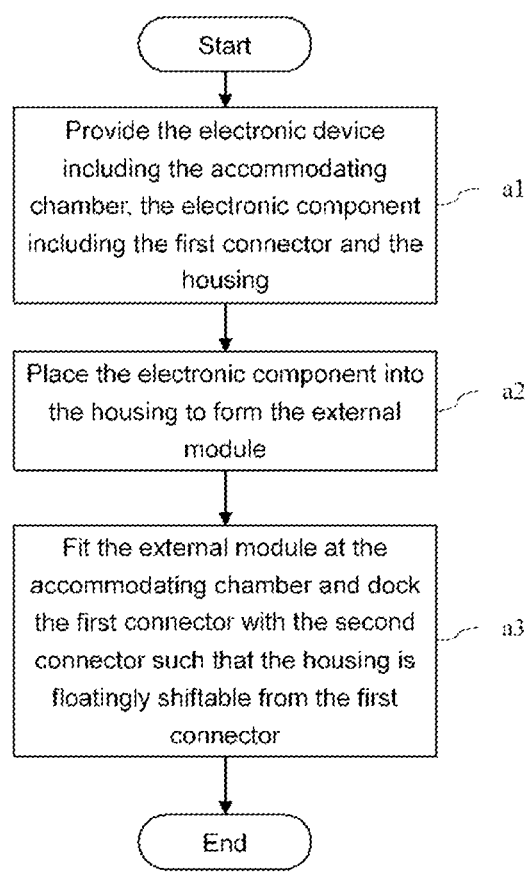
FIG. 8 is a flowchart of steps of an assembly method for configuring an external module to an electronic device of the present invention.

Referring to FIG. 1 and FIG. 8, an assembly method for configuring the external module 200 to the electronic device 10 is provided according to a third embodiment of the present invention. The assembly method includes the following steps.

First of all, in step a1, the electronic device 10, the electronic component 220 and the housing 210 are provided. The electronic device 10 includes a host, and the host casing 100 thereof is provided with an accommodating chamber 101, wherein a second connector 100a is disposed in the accommodating chamber 101. The electronic component 220 is provided with the first connector 200a, and the housing 210 is provided with the through hole 201 corresponding to the first connector 200a.

In step a2 following step a1, the electronic component 220 is placed in the housing 210 to form the external module 200, and the first connector 200a is disposed at the through hole 201.

In step a3 following step a2, one end of the external module 200 away from the first connector 200a is first fitted on one side of the accommodating chamber 101 by the tenon 211, and then the first connector 200a is docked with the second connector 100a, such that the housing 210 is floatingly shiftable from the first connector 200a at this point in time.

The electronic component 220 of the external module 200 of the electronic device 10 according to the present invention can be installed in the accommodating chamber 101 at the bottom of the electronic device 10 by a blind inverted fastening means, and can similarly be removed from the accommodating chamber 101 at the bottom of the electronic device 10. The first connector 200a of the external module 200 is floatingly arranged in the housing 210 and is allowed to be shiftable. Therefore, even if when the external module 200 is not fixedly fastened at the host casing 100, the first connector 200a and the second connector 100a docked with each other are insusceptible to instantaneous signal interruption when strong impact is received (for example, in a drop test from 4 feet).

The descriptions above provide merely preferred embodiments of the present invention, and are not to be construed as limitations to the present invention. Other equivalent changes practicing the inventive spirit of the present invention are encompassed within the scope of the appended claims of the present invention.

What is claimed is:

1. An external module, comprising:
    a housing, having one surface thereof provided with a through hole; and
    an electronic component, disposed in the housing, the electronic component comprising a first connector, the first connector floatingly arranged in the housing and exposed in the through hole;
    wherein the electronic component is shaped as a long plate, a first end of the electronic component is fixedly connected to the housing, a first surface of a second end of the electronic component and the housing are separated by a gap, and the first connector is located at a second surface of the second end of the electronic component opposite to the first surface, arranged such that the second end is shiftable relative to the housing in the gap.

2. The external module according to claim 1, wherein an insertion direction of the first connector is perpendicular to a longitudinal direction of the electronic component.

3. The external module according to claim 1, wherein an elastic element is disposed in the gap and sandwiched between the electronic component and the housing, and the elastic element and the first connector are respectively disposed on two opposite surfaces of the electronic component.

4. The external module according to claim 1, wherein the electronic component comprises a solid state drive and an adaptor board connected to the solid state drive, the first connector is disposed at the adaptor board and is electrically connected to the solid state drive, the first end of the electronic component comprising the solid state drive is fixedly connected to the housing, and the second end of the electronic component comprising the adaptor board is shiftable relative to the housing.

5. The external module according to claim 1, wherein the first end of the electronic component is fixedly connected to the housing as a fulcrum, and the second end of the electronic component is opposite to the first end as a free end, arranged such that the second end is shiftable relative to the housing.

6. A manufacturing method for an external module, the method comprising the steps of:
- m1) providing a housing and an electronic component, wherein one surface of the housing is provided with a through hole, and the electronic component comprises a first connector; and
- m2) disposing the electronic component in the housing, floatingly arranging the first connector in the housing and exposing the first connector in the through hole;

wherein the electronic component is shaped as a long plate, a first end of the electronic component is fixedly connected to the housing, a first surface of a second end of the electronic component and the housing are separated by a gap, and the first connector is located at a second surface of the second end of the electronic component opposite to the first surface such that the second end is shiftable relative to the housing in the gap.

7. The manufacturing method for the external module according to claim 6, wherein an insertion direction of the first connector is perpendicular to a longitudinal extension direction of the electronic component in step m2.

8. The manufacturing method for the external module according to claim 6, further comprising the step of:
- m3) disposing an elastic element on a side of the electronic component opposite to the first connector, such that the elastic element is sandwiched between the electronic component and the housing.

9. The manufacturing method for the external module according to claim 8, wherein the electronic component comprises a solid state drive and an adaptor board connected to the solid state drive, and in step m2, the first end of the electronic component comprising the solid state drive is fixedly connected to the housing and the second end of the electronic component comprising the adaptor board is shiftable relative to the housing.

10. An electronic device, comprising:
- an external module, comprising a housing and an electronic component, wherein the electronic component is disposed in the housing and comprises a first connector, the housing is provided with a through hole corresponding to the first connector, and the first connector is floatingly arranged in the through hole; and
- a host casing, having an outer surface provided with an accommodating chamber, the external module embedded in the accommodating chamber, the accommodating chamber provided with a second connector therein, wherein when one end of the external module away from the first connector is fitted on one side of the accommodating chamber and the first connector is docked with the second connector, the housing is floatingly shiftable from the first connector;

wherein the electronic component is shaped as a long plate, a first end of the electronic component is fixedly connected to the housing, a first surface of a second end of the electronic component and the housing are separated by a gap, and the first connector is located at a second surface of the second end of the electronic component opposite to the first surface, arranged such that the second end is shiftable relative to the housing in the gap.

11. The electronic device according to claim 10, wherein an elastic element is disposed in the gap and sandwiched between the electronic component and the housing, the elastic element and the first connector are respectively disposed on two opposite surfaces of the electronic component, and when the housing is shifted from the first connector, an amount of compression received by the elastic element is reduced.

12. The electronic device according to claim 10, wherein an insertion direction of the first connector to the second connector when docking the first connector with the second connector is perpendicular to a longitudinal extension direction of the electronic component.

13. The electronic device according to claim 10, wherein the first end of the electronic component is fixedly connected to the housing as a fulcrum, and the second end of the electronic component is opposite to the first end as a free end, arranged such that the second end is shiftable relative to the housing.

14. An assembly method for configuring an external module to an electronic device, the method comprising the steps of:
- a1) providing the electronic device, an electronic component and a housing, wherein a host casing of the electronic device is provided with an accommodating chamber, a second connector is provided in the accommodating chamber, the electronic component is provided with a first connector, and the housing is provided with a through hole corresponding to the first connector, and wherein a first end of the electronic component is fixedly connected to the housing;
- a2) placing the electronic component in the housing to form the external module, and disposing the first connector at the through hole; and
- a3) fitting one end of the external module away from the first connector to one side of the accommodating chamber first, and then docking the first connector with the second connector, such that, a first surface of a second end of the electronic component and the housing are separated by a gap, the first connector is located at a second surface of the second end of the electronic component opposite to the first surface, and the second end is shiftable relative to the housing in the gap.

15. The assembly method of claim 14, wherein an insertion direction of the first connector to the second connector when docking the first connector with the second connector is perpendicular to a longitudinal extension direction of the electronic component.

* * * * *